United States Patent [19]

Naoe

[11] Patent Number: 5,539,919

[45] Date of Patent: Jul. 23, 1996

[54] MICROCOMPUTER HAVING FUNCTION TO SPECIFY FUNCTIONAL BLOCK HAVING DATA TO BE MONITORED AND TO OUTPUT DATA AS AN ANAGLOG SIGNAL

[75] Inventor: Yukihisa Naoe, Hyogo-ken, Japan

[73] Assignee: Mitsubishi Denki Kabushiki Kaisha, Tokyo, Japan

[21] Appl. No.: 265,556

[22] Filed: Jun. 24, 1994

Related U.S. Application Data

[63] Continuation of Ser. No. 710,490, Jun. 5, 1991, abandoned.

[30] Foreign Application Priority Data

Aug. 31, 1990  [JP]  Japan .................... 2-230942

[51] Int. Cl.$^6$ ................ G06F 13/00; G06F 13/20
[52] U.S. Cl. ............... 395/856; 395/889; 395/775; 395/878; 364/DIG. 1
[58] Field of Search ............... 395/400, 425, 395/775, 856, 878, 889; 364/DIG. 1; 365/222; 341/172

[56] References Cited

U.S. PATENT DOCUMENTS 4,202,046  5/2980  Ward ...................... 365/222
4,301,513  11/1981 Hara et al. ................ 395/500
4,326,192  4/1982  Merrill et al. ............. 341/172
4,517,671  5/1985  Lewis ..................... 395/183.14
4,975,837  12/1990 Woodward et al. ........... 395/375

FOREIGN PATENT DOCUMENTS 3331572  4/1985  Germany .

OTHER PUBLICATIONS

"Diagnostic Registers Simplify System Self–Testing," Ow–Wing *Electronic Design*, Oct. 27, 1983.

*Primary Examiner*—Tod R. Swann
*Assistant Examiner*—James Peikari
*Attorney, Agent, or Firm*—Townsend and Townsend and Crew

[57]  ABSTRACT

A microcomputer includes addressable functional blocks and an internal state latch coupling an A/D converter to an internal bus. A programmable selector is coupled to the address bus and controls the latch to latch data when a selected address is generated on the address bus to that the latched data is provided as an external analog signal for monitoring.

8 Claims, 6 Drawing Sheets

LDM　#DATA, ADL (∅∅ADL) ← DATA

MICROCOMPUTER HAVING FUNCTION TO SPECIFY FUNCTIONAL BLOCK HAVING DATA TO BE MONITORED AND TO OUTPUT DATA AS AN ANAGLOG SIGNAL

This is a Continuation Ser. No. 07/710,490, filed Jun. 5, 1991, now abandoned.

BACKGROUND OF THE INVENTION

1. Field of the Invention

The present invention relates to a microcomputer which outputs the states of LSI internal operations and internal storage devices to the outside.

2. Description of the Prior Art

FIG. 7 is a block diagram showing the internal configuration of a conventional single-chip microcomputer with a built-in D/A converter. In the figure, 1 shows a whole view of the single-chip microcomputer which incorporates program counter 2, general-purpose register 3, ROM 4, RAM 5, D/A converter 6 and register 7 for D/A converters. These devices including the register for D/A converters are connected to data bus 8 and address bus 9. The directions of arrows shown by the data bus 8 and address bus 9 indicate the directions of input and output of signals on the buses (address data and data). 10 is the input of said D/A converter 6 which is output from register 7 for D/A converters. 11 is a bus timing controller which controls buses 8 and 9 within the microcomputer 1 and outputs part of timing to the outside of the microcomputer as bus timing control signal 12. 13 is the analog output of D/A converter 6, and 14 and 15 are signal outputs from data bus 8 and address bus 9 within the microcomputer to the outside of the microcomputer, respectively. 16 is an interrupt controller which controls interrupt handling within the microcomputer, according to interrupt input 17 from outside.

A multi-axis cable is used for the parallel outputs of output signals 12, 14 and 15, and the terminal of microcomputer 1 is comprised of many pins.

The operation will be described next. Program counter 2, general-purpose register 3, ROM 4 and RAM 5 are connected to data bus 8 and address bus 9 for transmitting information under the time-slot control of bus timing controller 11. FIG.8 shows an example of the operation. The addresses and written/read contents of program counter 2, general-purpose register 3, ROM 4 and RAM 5 appear on address bus 9 and data bus 8 on a time-division basis and are specified by timing control signal 12.

Basic clock 4 12a, SYNC signal 12b, $\overline{WR}$ signal 12c and $\overline{RD}$ signal 12d shown in FIG.8 are output from bus timing controller 11. The first number 23a of an instruction code which appears on address bus 9 is shown by the fall of SYNC signal 12b and is the address PC of the program counter. Data 25 are written by the rise of $\overline{WR}$ signal 12c as $DATA_x$ on RAM 5 with an address 24 of $00AD_L$ shown by address bus 9.

$AD_H$ is an 8-bit upper address, while $AD_L$ is an 8-bit lower address. Signal φ is a basic instruction clock, SYNC signal is the first address timing of the instruction code, WR is writing timing to program counter 2, general-purpose register 3 and RAM 5, and $\overline{RD}$ is reading timing from program counter 2, general-purpose register 3, ROM 4 and RAM 5. Like general-purpose register 3, register 7 for D/A converters is connected to address bus 9 and data bus 8 to enable bus timing controller 11 to write data from data bus 8 and read data out to data bus 8. The written (latched) contents of register 7 for D/A converters are input into D/A converter 6 as input 10 of the D/A converter. D/A converter 6 converts digital data into analog signals for outputting to the outside of microcomputer 1 as output 13 of the D/A converter.

There are two methods to output the contents of program counter 2, general-purpose register 3, ROM 4 and RAM 5 within the microcomputer to the outside of the microcomputer 1. One is to output bus timing control signal 12, address bus output 14 and data bus output 15 to the outside of microcomputer 1 and to achieve these contents in the RAM 5 and others from relations among the three timings.

The other method is to use software to transfer the contents of program counter 2, general-purpose register 3, ROM 4 and RAM 5 to register 7 for D/A converters via data bus 8 and to achieve these contents as output 13 of the D/A converter.

Since microcomputer 1 incorporates interrupt input 17 and an interrupt controller 16, it can control the execution of interrupt programs.

The contents of these devices including RAM 5 are input into register 7 for D/A converters as occasion demands through the execution of this interrupt program. The contents including those of RAM 5 are not transferred to register 7 for D/A converters without the occurrence of interrupt. After interrupt, the processing of a main program is suspended.

Since the conventional single-chip microcomputer 1 with a built-in D/A converter is configured as described above, there have been two methods to output the internal states of the microcomputer including that of the program counter to the outside of the microcomputer: the first method is to output all of address bus, data bus and bus timing control signals, while the second method is to transfer desired data to register 7 for D/A converters according to software instructions and to achieve them from the output of the D/A converter 6.

The first method needs a large number of signal pins. Therefore, it has been difficult for high-density, small-sized single-chip microcomputers which have restrictions on the number of pins per microcomputer to mount a large number of pins because of small volume and mounting difficulties. Since measurement signals are digital, it also has been difficult to identify them from lines of pulses observed.

The second method uses software and accordingly, takes a long time to output the contents to the outside. It has had a disadvantage that a program required for the regular output of the contents to the outside is very large in volume.

SUMMARY OF THE INVENTION

It is therefore an object of the invention to provide a single-chip microcomputer with built-in D/A converters which can output the contents of a program counter, general-purpose register, ROM and RAM within the microcomputer to the outside of the microcomputer at a high speed and with a small number of additional pins.

According to the invention, an internal state latch has a variable address which can be set by instructions from an internal state supervisory selector. As a result, the contents of the RAM, for instance, can be read by designating the desired address in the RAM to the latch.

DESCRIPTION OF THE PREFERRED EMBODIMENT

Figure 1:
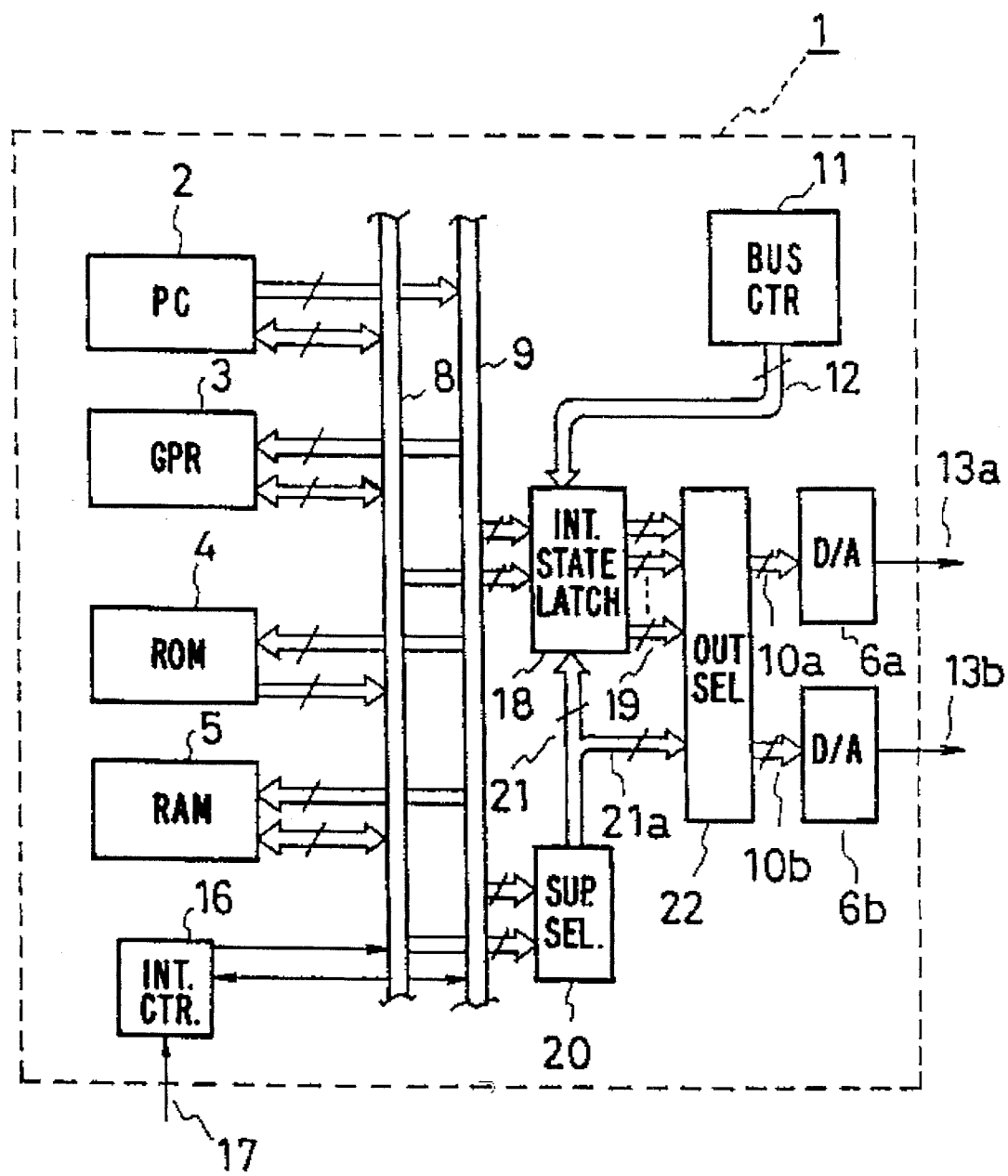
FIG. 1 is a schematic block diagram showing an embodiment of a microcomputer according to this invention.

Referring to the accompanying drawings, description will be given in detail of an embodiment of a single-chip microcomputer with built-in D/A converters. FIG. 1 is a block diagram showing the internal configuration of a single-chip microcomputer with built-in D/A converters according to the invention. In the figure, microcomputer 1 incorporates the memory blocks of program counter 2, general-purpose register 3, ROM 4 and RAM 5, all of which are connected to data bus 8 and address bus 9. These devices from program counter 2 to RAM 5 have sequential addresses from 0000 to FFFF so that the microcomputer can select a desired memory block simply by specifying its address. The directions of arrows shown by data bus 8 and address bus 9 are the directions of input and output of signals on the buses (address data and data). 11 is a bus timing controller which controls buses 8 and 9 within microcomputer 1. 16 is an interrupt controller which controls interrupt handling within the microcomputer according to interrupt input 17 from the outside.

6a and 6b are the built-in D/A converters of microcomputer 1 which enter inputs 10a and 10b of the D/A converters and generates outputs 13a and 13b of the D/A converters to the outside of microcomputer 1. 18 is an internal state latch which stores temporarily the contents of desired internal states of built-in devices such as RAM 5 of the microcomputer. 19 is the output signal of multiple internal states stored, and 20 an internal state supervisory selector which specifies desired internal states. The output signal of selector 21 is given to said internal state latch 18. Command signal 21a which specifies which contents of latch 18 should be output to D/A converters 6a and 6b is output from selector 20 to output selector 22. 12 is the output of bus timing controller 11 for the internal state latch 18. 22 is an output selector which selects two out of multiple output signals 19 of internal state latch 18 for input into D/A converters 6a and 6b.

Figure 3:
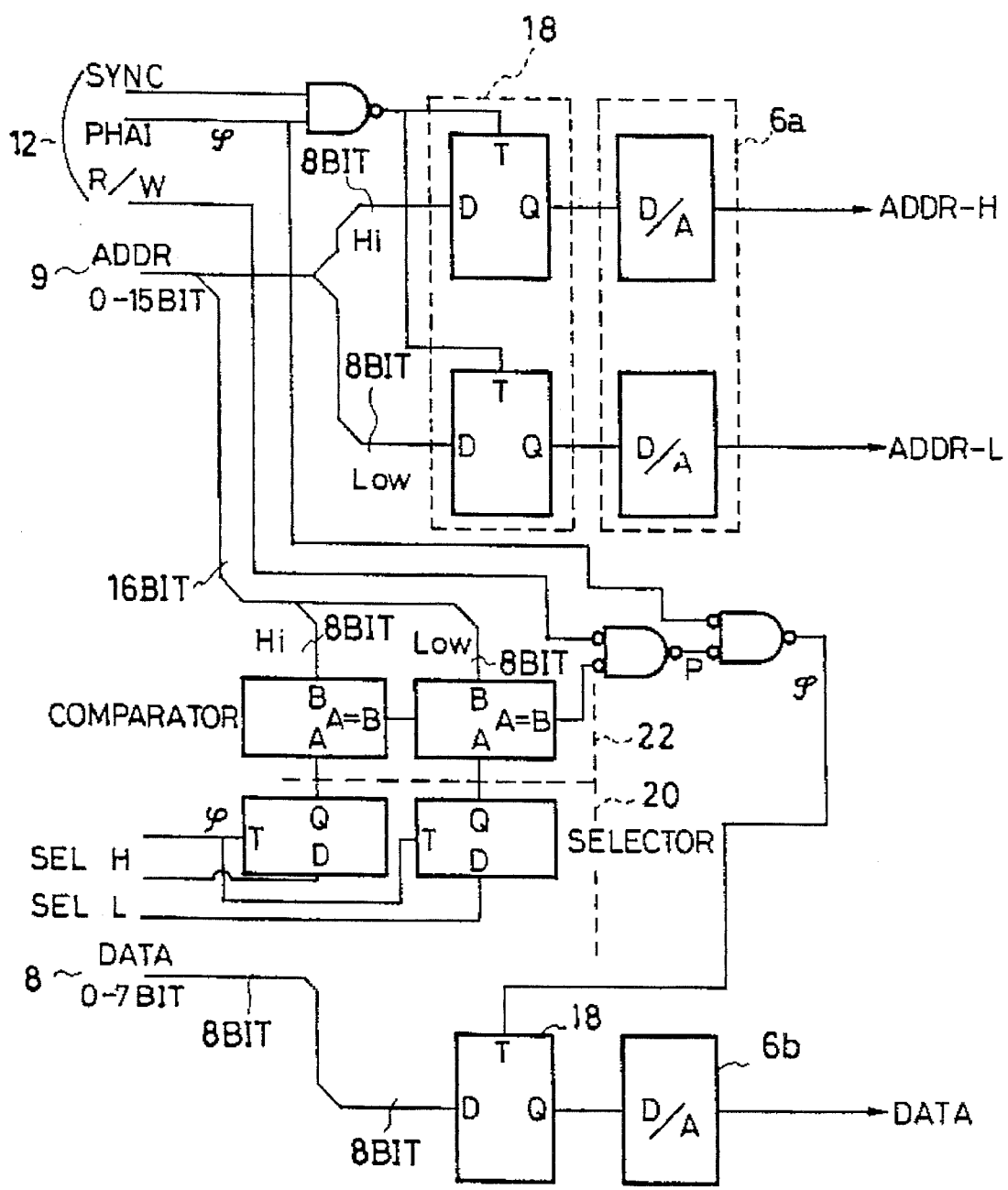
FIG. 3 is a diagram showing an example of concrete circuitry of the key section of FIG. 1.

FIG. 3 shows an example of concrete circuitry of D/A converters 6a and 6b, internal state supervisory selector 20, internal state latch 18 and output selector 22. In the figure, latch 18 is separated, but can be integrated on the same IC. Since the number of D/A converters 6a and 6b is not limited to two, it can be increased within the limits of the capacity of microcomputer 1.

The latch consists of 8-bit flip-flop shift registers and selector 20 is also composed of similar shift registors. Output selector 22 is made up of comparators and compares an address value from selector 20 with an address value on bus 9. It outputs coincidence signal P when the two values are the same.

In this embodiment, a 16-bit address consists of upper 8 bits (H) and lower 8 bits (L). That is, when an address specified by selector 20 agrees with an address on bus 9, address data (H+L) and 8-bit data at that time are converted by D/A converters 6a and 6b for output to the outside of the microcomputer. Internal state supervisory selector 20 is programmed by the microcomputer via buses 8 and 9 in advance to enable the specification of a memory block and an address. Since the specification is performed before the microcomputer begins task processing, it does not affect the performance of the microcomputer.

The operation will be described next. Internal state supervisory selector 20 is used to specify two desired internal states to be monitored. Output signal 21 from internal state supervisory selector 20 controls internal state latch 18. Latch 18 selects and stores temporarily specified states out of those of program counter 2, general-purpose register 3, ROM 4 and RAM 5, according to information from bus timing control signal 12, address bus 9 and data bus 8. Command signal 21a is given from selector 20 to output selector 22, but the states of two specific addresses can be selected from the different blocks of program counter 2, general-purpose register 3, ROM 4 and RAM 5, or the states of two specific addresses can be selected from a single block (for instance RAM).

Figure 2:
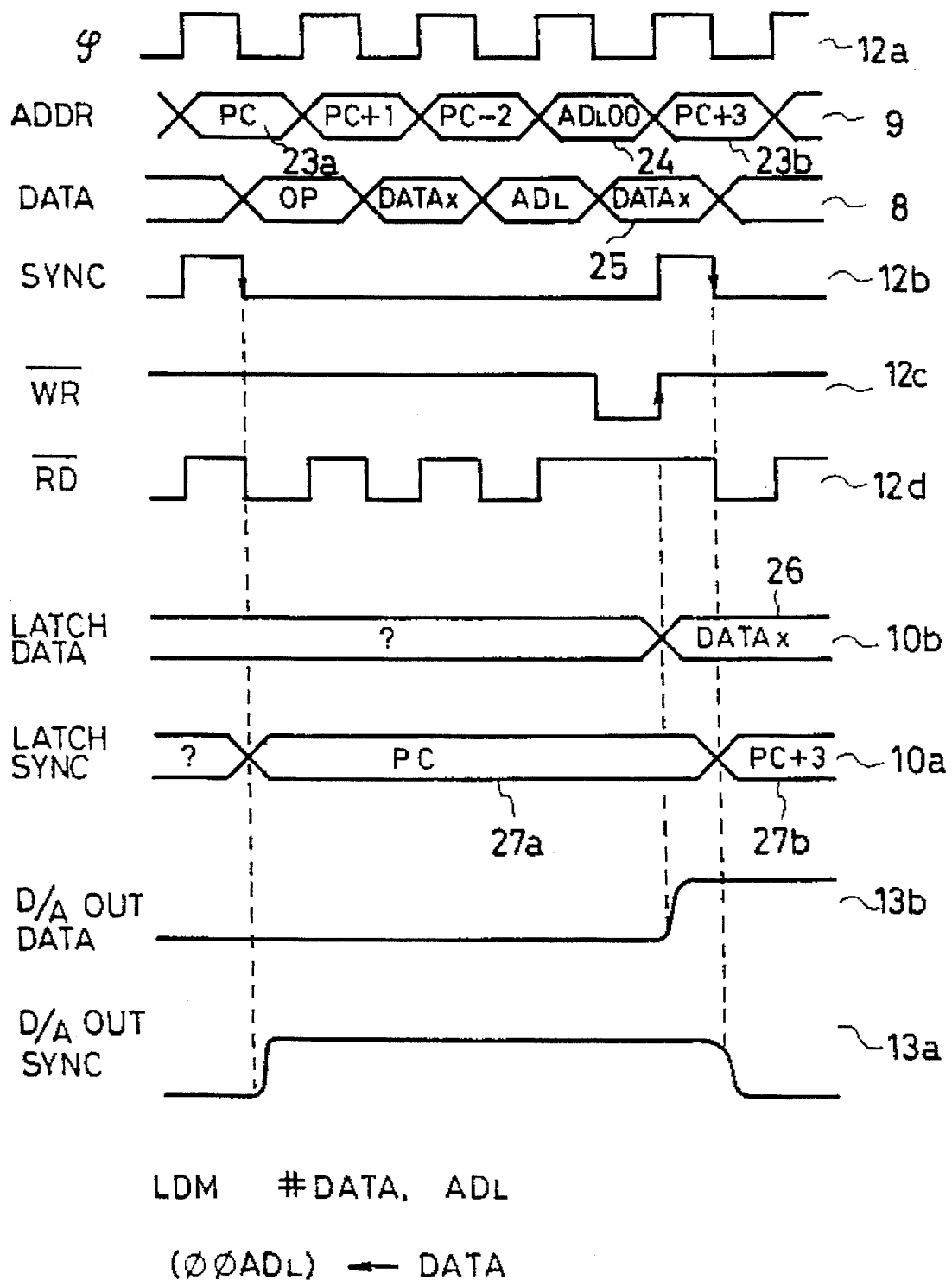
FIG. 2 is a diagram showing the operation timing of the embodiment.

An example of the operation of internal state latch 18 will be described, referring to FIG. 2. In the figure, φ, SYNC, $\overline{WR}$ and $\overline{RD}$ are bus timing control signals 12a to 12d, ADDR is the contents of address bus 9, and DATA is the contents of data bus 8. In this example, the contents of program counter 2 and the (written) contents of RAM 5 with an address of $AD_L$ (lower address) are selected by internal state supervisory selector 22. Internal state latch 18 latches the value of program counter 2 on address bus 9 with the rising edge of SYNC signal for the temporary storage of LATCH SYNC as one of output signals 19 from internal state latch 18. The contents of RAM 5 with an address of $AD_L$ which appear on the data bus 8 when the value of address bus 9 becomes $AD_L$ are latched with the rising edge of $\overline{WR}$ signal for the temporary storage of LATCH DATA as another output of output signals 19 from internal state latch 18. Internal state latch 18 records and stores addresses and data specified by selector 20 one after another within the limits of its capacity. In the embodiment, the state of program counter 2 (LATCH SYNC) and the state of RAM 5 with an address of $AD_L$ (LATCH DATA) are selected by the output selector 22 from the state group of the output signal 19 from the internal state latch 18 according to the command signal 21a from the internal state supervisory selector 20, and each is output to inputs 10a and 10b of the two D/A converters. D/A converters 6a and 6b convert their inputs 10a and 10b (digital values) into analog values for outputting to the outside of the microcomputer as outputs 13a and 13b of the D/A converters.

Figure 6:
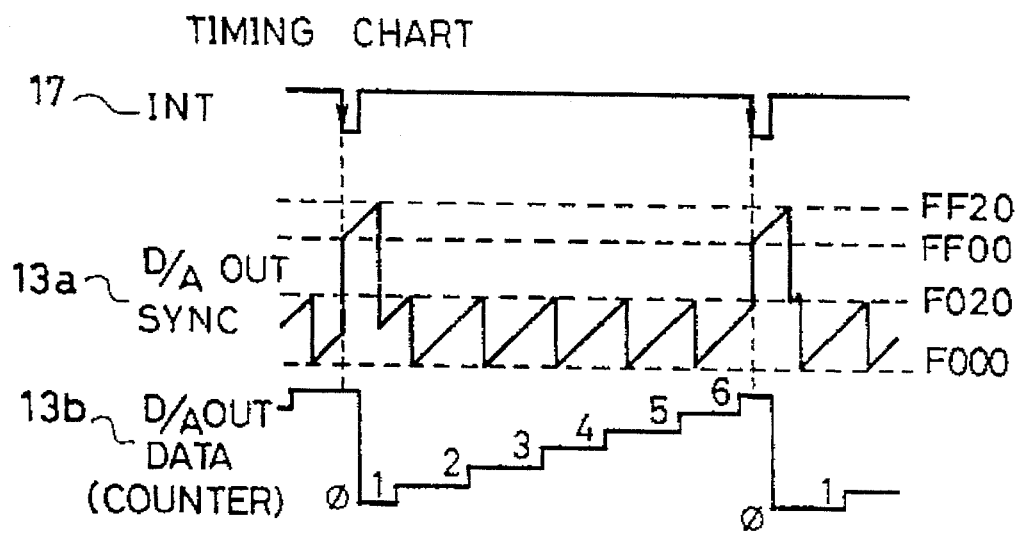
FIG. 6 is a graph showing the results of the invention.
Figure 7:
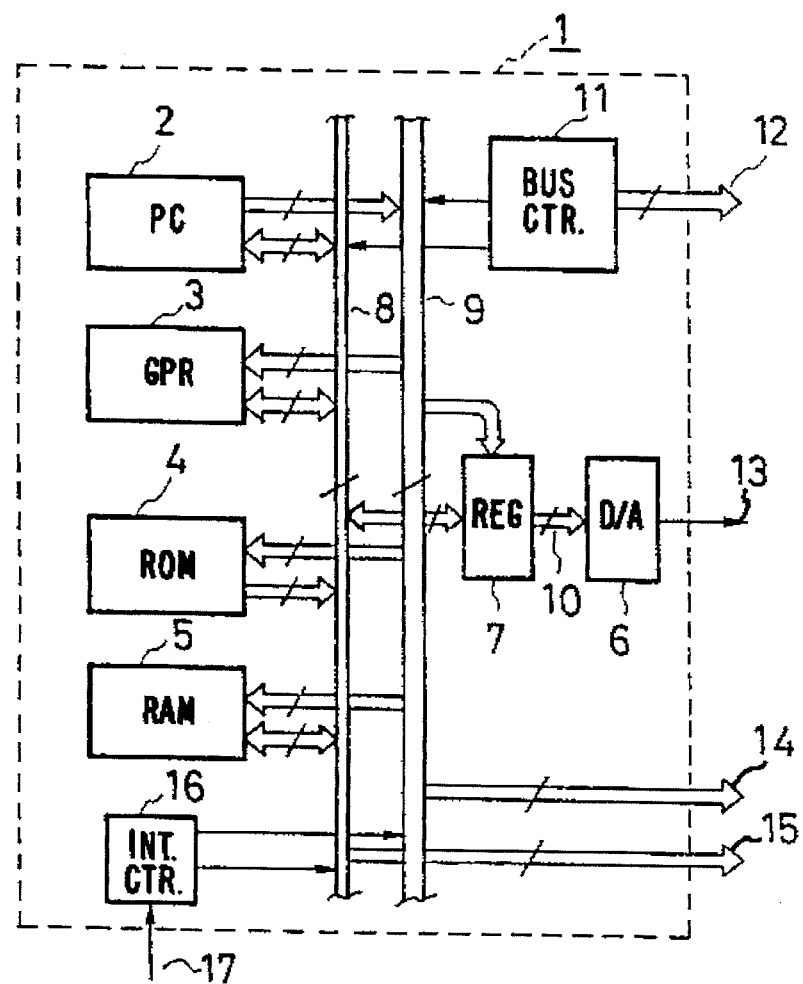
FIG. 7 shows the configuration of a conventional microcomputer.
Figure 8:
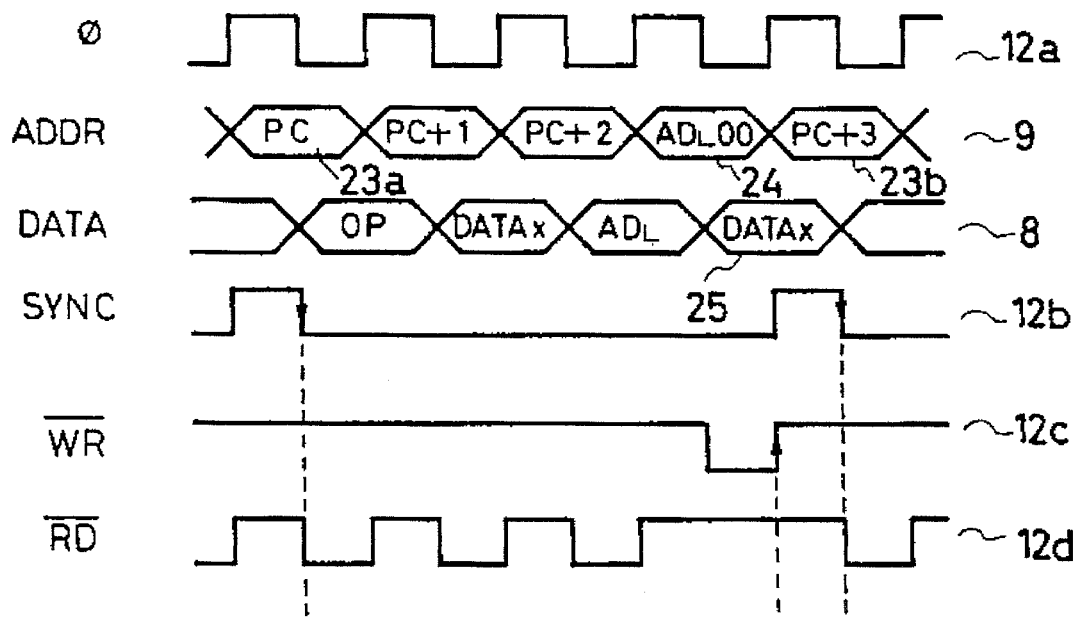
FIG. 8 is a diagram showing the operation timing of the conventional microcomputer.

D/A converter 6 may be of resistive potential dividing system such as R–2R type or pulse wide modulation (PWM) output system. The present embodiment is of R–2R type, but in case of PWM type, outputs 13a and 13b of the D/A converters are PWM waveforms from which analog waveforms 13a and 13b shown in FIG. 6 are obtained after passing through an integrating circuit.

An example of the operation will be described when a program is executed.

Figure 4A:
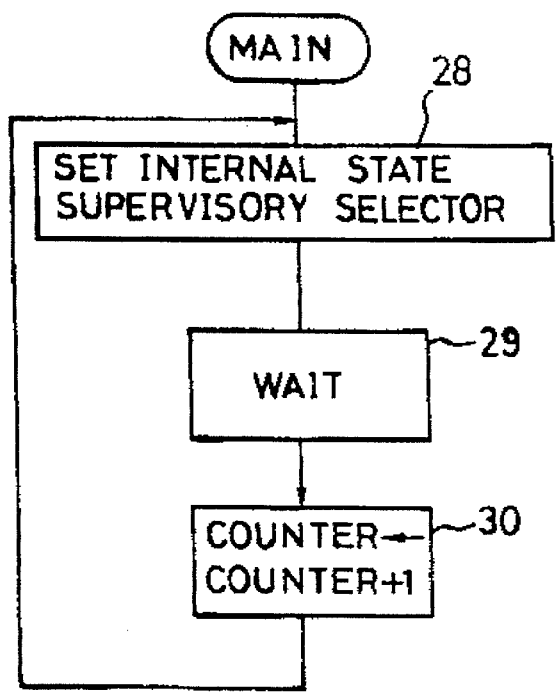
FIGS. 4A and 4B are flowcharts describing the operation of the embodiment.
Figure 4B:
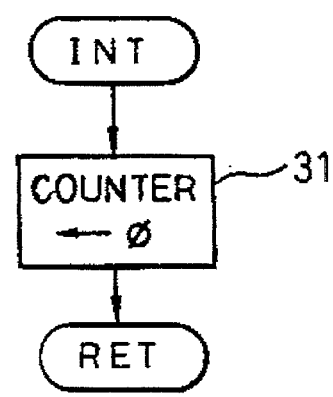
Figure 5:
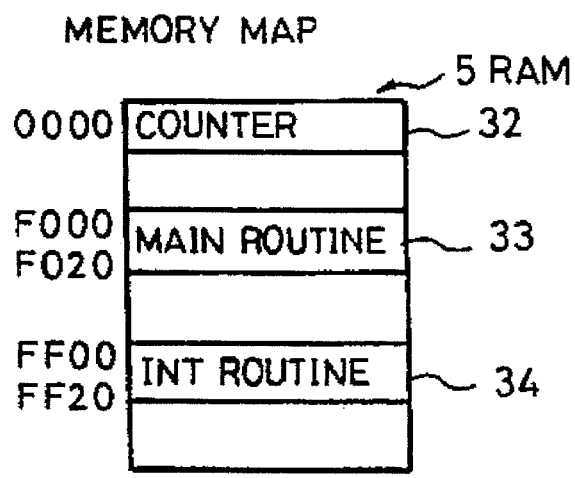
FIG. 5 is a diagram showing a memory map.

FIG. 4 is a flow chart of a sample program. In the main routine (MAIN) of FIG. 4(a), internal state supervisory selector 20 is programmed in such a way that the state of program counter 2 and the contents of RAM 5 with an address of 0000 are output to D/A converter 6a and D/A converter 6b, respectively (step 28). Then, an interval of a certain time follows (step 29) and the processing (step 30) of increasing one by one the contents of RAM 5 with an address of 0000 is permanently looped (to label "COUNTER") (steps 29, 30, 29 . . . ). Meanwhile, in the general interrupt handling (INT) of FIG. 4(b), the processing (step 31) of clearing the contents of the counter every time external interrupt input 17 shown in FIG. 1 is detected is provided. When the above program and COUNTER data are allocated to the address of MEMORY MAP shown in FIG. 5 to execute the program, waveforms shown in FIG. 6 are output to output signals 13a and 13b of D/A converters 6a and 6b. 32 indicates the address range of the COUNTER (0000+i), 33 the address range of the main routine (F000 to F020), and 34 the address range of interrupt handling (FF00 to FF20). It is easily observed from outputs 13a and 13b of D/A converters 6a and 6b displayed on the oscilloscope that the address numbers jump and the contents of COUNTER are cleared every time interrupt occurs.

According to the invention, when software is used to specify an address to be monitored, an additional selector and the latch automatically output the contents continuously to the outside, resulting in a small increase in the number of programs. In addition, the microcomputer with this configuration can be used as an ordinary single-chip microcomputer with a built-in D/A converter for peripheral analog control even when the external supervision of internal states is unnecessary, because the D/A converters can be controlled directly by software as before.

As described above, according to this invention, the contents of RAM can be freely output to the outside of the microcomputer on a real-time basis for observation. Internal operation conditions can be read from the oscilloscope with a small number of pins and a limited size almost unchanged. Internal states can also be freely monitored when software is debugged and the operation of programs which was invisible originally can be captured visually so that programs developed by other people can be analyzed and evaluated.

What is claimed is:

1. A microcomputer provided with addressable functional blocks including a program counter, general-purpose register block, ROM and RAM which are all interconnected by an internal common address bus and data bus with each addressable functional block specified by a unique address asserted on said address bus, and also provided with a bus timing controller which provides control signals to control access to said address bus and data bus by said functional blocks, said microcomputer comprising:

a D/A converter, having a digital input for receiving a plurality of signals encoding a digital value and an analog output, for reading a digital value provide at its inputs and converting said digital value into an analog value provided at its output;

an internal latch, having inputs connected to said internal data bus and said internal address bus, an output coupled to the digital input of said D/A convertor, and a control input for receiving a control signal, for latching a digital value transmitted on a selected internal bus when said control signal is asserted and providing said latched digital value to the digital input of said D/A converter; and a programmable internal supervisory selector, having inputs coupled to said internal address bus and said internal data bus and a control output coupled to the control input of said internal latch, said internal supervisory selector including an output selecting latch for pre-storing an address value of digital data, stored in a functional unit, to be observed and control means for activating said internal latch by applying said control signal to said internal latch when the address value stored in said output selection latch is asserted on said internal address bus and for causing said internal latch to latch the digital data present on said internal data bus so that the digital data from said internal latch is converted by said D/A converter.

2. A microcomputer according to claim 1, wherein:

said internal supervisory selector is programmed in advance, via said data bus and address bus, to enable it to specify a memory block.

3. A microcomputer according to claim 1, wherein:

said internal latch consists of flip-flop shift registers.

4. A microcomputer according to claim 1, wherein:

said D/A converter outputs the internal content of said memory block specified by said internal supervisory selector as an analog signal.

5. The microcomputer according to claim 1 further comprising:

means for setting an address of a functional block to be monitored in said supervisory selector.

6. A microcomputer provided with addressable functional blocks including a program counter, general-purpose register block, ROM and RAM which are all interconnected by a common address bus and data bus with each addressable functional block specified by a unique address asserted on said address bus, and also provided with a bus timing controller which provides control signals to control access to said address bus and data bus by said functional blocks, said microcomputer comprising:

a D/A converter, having a digital input for receiving a plurality of signals encoding a digital value and an analog output, for reading a digital value provide at its inputs and converting said digital value into an analog value provided at its output;

internal latches, including a first set of internal latches having inputs connected to said data bus and a second set of internal latches connected to said address bus, each internal latch having an output coupled to the digital input of said D/A convertor, and said first set of internal latches having a control input for receiving a control signal, for latching data on said data bus when said control signal is asserted and providing said latched data to the digital input of said D/A converter; and a programmable internal supervisory selector, having inputs coupled to said address bus and said data bus and a control output coupled to the control input of said first set of internal latches, said internal supervisory selector including an output selecting latch for prestoring an address value of digital data, stored in a functional block, to be observed and including control means for activating said first set of internal latches by applying said control signal to said first set of internal latches when the address value stored in said output selecting latch is output by said program counter to latch the digital data present on said internal data bus so that the digital data from said first set of internal latches is converted by said D/A converter.

7. A microcomputer according to claim 1 or 6, wherein:

said control means is a comparator.

8. A microcomputer according to claim 7, wherein:

when an address value stored in said shift register and an address value input from said address bus are compared by one of said comparator circuits and when the compared values are the same, the contents of said functional block specified by these address values are output to said D/A converters.

* * * * *